United States Patent
Pushpala et al.

[11] Patent Number: 6,010,951
[45] Date of Patent: Jan. 4, 2000

[54] DUAL SIDE FABRICATED SEMICONDUCTOR WAFER

[75] Inventors: Sagar Pushpala; Abdalla Naem, both of Sunnyvale, Calif.

[73] Assignee: National Semiconductor Corporation, Santa Clara, Calif.

[21] Appl. No.: 09/060,004

[22] Filed: Apr. 14, 1998

[51] Int. Cl.$^7$ .............................. H01L 21/30; H01L 21/46
[52] U.S. Cl. ........................ 438/458; 438/459; 438/928; 156/344
[58] Field of Search ..................... 438/458, 459, 438/460, 717, 928; 156/60, 344

[56] References Cited

U.S. PATENT DOCUMENTS

| | | | |
|---|---|---|---|
| 3,928,093 | 12/1975 | van Tongerloo et al. | 148/186 |
| 3,937,579 | 2/1976 | Schmidt | 356/144 |
| 4,189,820 | 2/1980 | Slack | 29/425 |
| 4,261,781 | 4/1981 | Edmonds | 156/254 |
| 4,782,028 | 11/1988 | Farrier et al. | 437/3 |
| 5,142,756 | 9/1992 | Ibaraki et al. | 29/25.01 |
| 5,240,882 | 8/1993 | Satoh et al. | 437/226 |
| 5,250,460 | 10/1993 | Yamagata | 437/62 |
| 5,362,683 | 11/1994 | Takenaka | 437/226 |
| 5,530,552 | 6/1996 | Mermagen et al. | 356/401 |
| 5,739,067 | 4/1998 | DeBusk | 438/618 |

FOREIGN PATENT DOCUMENTS 64-19729  1/1989  Japan ........................ H01L 21/304

*Primary Examiner*—Charles Bowers
*Assistant Examiner*—Nema Berezny
*Attorney, Agent, or Firm*—Limbach & Limbach LLP

[57] ABSTRACT

A method is provided involving re-slicing a wafer after dual-side alignment and processing has been performed. This procedure provides twice as many processed electronic devices without increasing the number of loading, processing and unloading procedures performed or the total number of substrates used. Another method is provided for creating two processed chips by attaching two conventional substrates, processing IC's on each of the two exposed, polished sides and then detaching the substrates. This technique reduces the number of loading, processing and unloading procedures required to produce a given number of IC chips by half. An apparatus and further method provides two different subsystems of a single IC processed on opposite sides of the same chip. Such a device saves cost by using fewer substrates to make the same number of chips. Also, the method performs loading, processing and unloading procedures half as much to produce a given number of IC's. The apparatus is an integrated circuit chip comprising two subsystems, each processed on a different side of the same silicon substrate. Sizes of chips is thereby decreased due to the smaller width of the substrate that results after processing.

12 Claims, 3 Drawing Sheets

DUAL SIDE FABRICATED SEMICONDUCTOR WAFER

BACKGROUND OF THE INVENTION

1. Field of the Invention

The present invention relates to the fabrication of integrated circuit devices, and more particularly to two-sided wafer processing, either followed by re-slicing the wafer or detaching two previously attached wafers after the two-sided wafer processing. or including one of two subsystems of the same IC on each side of one chip.

2. Discussion of the Related Art

As the electronics industry has progressed, IC's have become more versatile and more complex. Fortunately, advances in reducing the size of IC's have paralleled progress in IC development. The advent and continued successes of photoelectron lithography, e.g., have enabled chipmakers to shrink their products tremendously by shrinking circuit element sizes. However, there is an ongoing need for new cost effective techniques for reducing the size of IC's.

Processing of a semiconductor substrate 2 on one side to form circuit elements is a well established art. FIG. 1A shows a conventional substrate 2, which may be a semiconductor or an insulator, but for most integrated circuit applications is silicon. Only one side, e.g., the topside 4 of the substrate 2, is polished for conventional one-sided processing purposes to remove coarseness and irregularities causing the topside 4 to become substantially planar.

To process the topside 4 only of a semiconductor substrate 2 after polishing, the substrate 2 is first loaded into unilateral processing equipment. The wafer may be supported anywhere on the underside 6 as no processing is to take place there. The processing is focused at one planar surface facing in only one direction at a time. After processing is performed on the topside 4, the substrate 2 is unloaded. The underside 6 of the substrate is not aligned nor processed and is often in full contact with a support during loading, processing, unloading and/or storing. In contrast, dual-side processing involves consideration of the underside 6 for loading, alignment, processing, unloading and storing.

It is known in the art to polish and process transistors and discrete devices on both the topside 4 and the underside 6 of a wafer, thereby dual-side processing the wafer. A known technique for alignment and preparation of a wafer for dual-side exposure involves mutually aligning two exposure masks and aligning the wafer in between. In U.S. Pat. No. 3,939,579 to Schmidt, mutual parallel and rotational alignment of two exposure masks is achieved by bringing first and second exposure masks in plane parallel contact, and then moving them apart in a direction perpendicular to their planes while maintaining the plane parallel alignment.

The process utilizes a pair of coupled rotational compound slide tables each having a mask support for supporting one of the two masks. The wafer is placed in air cushion free contact with the first mask and then separated by a fixed distance and aligned relative to the first mask. The second mask is moved into position a fixed distance from the wafer, and the wafer is dual-side exposed to, e.g., UV radiation.

Another technique is disclosed in U.S. Pat. No. 5,530,552 to Mermagen and Geil. In that disclosure, a flat edge of a wafer is aligned with a first and second masks in sequence utilizing a rotational alignment guide. Each mask has two windows aligned symmetrically about a vertical center line and each is aligned with an edge of the wafer. The wafer is once again dual-side exposed after alignment is completed.

Substantially congruent dual-side processing of a substrate to produce a bi-directional solid state device, or a switch, is disclosed in U.S. Pat. No. 3,928,093 to van Tangerloo et al. In that patent, each side of a silicon wafer has an oxide layer and is photoengraved and boron diffused to form $P^+$-type bases. Then, $N^+$-type emitter regions are formed on each side by photoengraving followed by phosphorus deposition and diffusion. The switching device is completed by attaching electrical contacts to the base and emitter regions after passivation and photoengraving to open contacts.

Another solid state device involving dual-side processing is disclosed in U.S. Pat. No. 4,782,028 to Farrier et al. This time, a detector device is processed by first depositing a $P^-$-type blocking layer and growing an oxide layer on both sides of a substrate before coating an etch resistant layer of Si-nitride. A window is opened through the etch resist and oxide layers by photolithography and the substrate is etched through the window to produce a thinned region on one side. Selective etching of the thinned side and formation of contacts on the non-thinned side is followed by separation of the thinned region of the substrate from its thicker counterpart. Electrical attachment of the contacts to a readout device enables the device as an IR detector.

Both Farrier and van Tangerloo involve multiple dual-side processing steps to produce a solid state device. Neither of these references, however, contemplates dual-side processing to produce an IC.

Re-slicing of a wafer that has been previously cut from a solid ingot to standard thickness has been performed in limited circumstances. In U.S. Pat. No. 4,261,781 to Edmonds et al., a method of re-slicing a wafer, wherein a layer of supporting material is first bound to each side of the wafer, is disclosed. The method requires intimate contact between bonding material and both substrate surfaces. The re-slicing technique of Edmonds can therefore not be performed on a wafer containing a previously processed IC on one or both sides.

U.S. Pat. No. 5,142,256 to Ibaraki uses a vacuum chucking mechanism for holding a wafer vertical prior to re-slicing. The disclosure is drawn primarily to an apparatus for loading an original intact wafer and unloading the two wafers remaining after re-slicing the original wafer. The point of Ibaraki is to speed the re-slicing process.

Both U.S. Pat. No. 5,240,882 to Satoh et al. and Japanese Patent No. Sho 64-19729 disclose further re-slicing techniques. Each of these techniques involves dividing a wafer into two sheets for making discreet components, such as transistors, diodes, and the like.

The re-slicing techniques of Satoh and Jap. Pat. No. Sho 64-19729 are drawn to creating substrates for further processing of discreet electronic components. IC processing is not contemplated, either before or after re-slicing. Moreover, IC processing cannot be performed on substrates prior to re-slicing via the techniques of either Edmonds or Ibaraki because these techniques would undesirably molest the processed IC.

SUMMARY OF THE INVENTION

A method of the present invention involves re-slicing a wafer after dual-side alignment and processing has been performed. This procedure provides twice as many unilaterally processed electronic devices without increasing the number of loading, aligning and unloading procedures performed or the total number of substrates used. The procedure advantageously reduces the time and costs of IC production.

Another method of the present invention involves creating two processed IC's by attaching two conventional wafers, processing IC's on each of the two exposed, polished sides and then detaching the substrates. This technique also reduces the number of loading, alignment and unloading procedures required to produce a given number of IC chips by half, thus saving time and cost.

An apparatus and further method of the present invention involves processing of two different subsystems of a single IC on opposite sides of a wafer, thus utilizing less wafer area without manipulating component geometries. Such a technique saves time and cost by using less substrate area per device, and by loading, aligning and unloading substrates half as often to produce a given number of IC's as conventional unilateral processing techniques do.

DETAILED DESCRIPTION OF THE PREFERRED EMBODIMENT

Figure 1A:
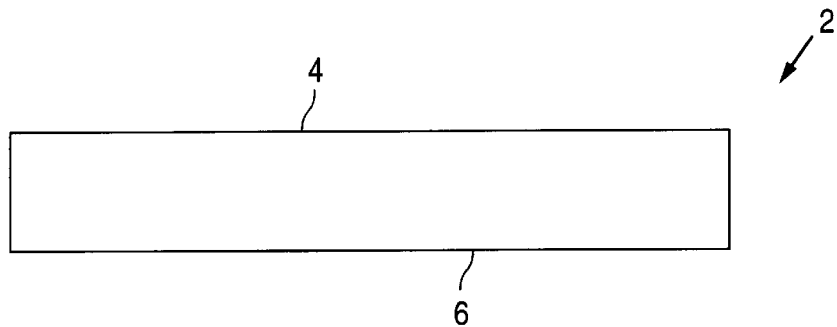
FIG. 1A is a side view of a conventional, polished, yet otherwise unprocessed substrate.
Figure 1B:
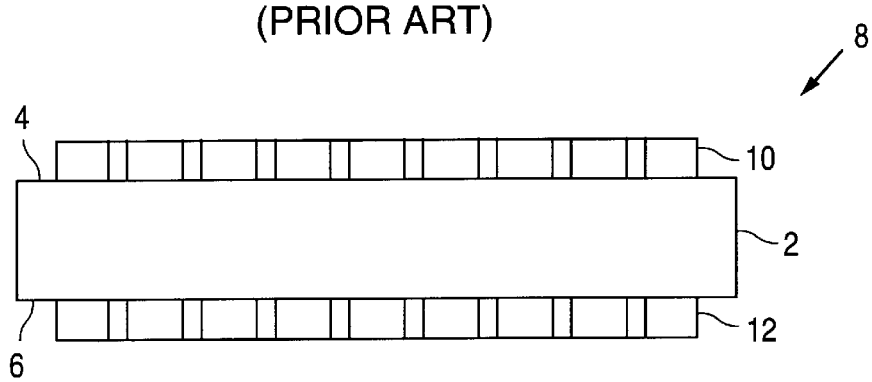
FIG. 1B is a side view of a dual-side processed substrate of the prior art.

FIG. 1B shows a dual-side processed substrate 8 according to a first embodiment of the present invention, having topside processing 10 on its topside 4 and underside processing 12 on its underside 6. The material comprising the substrate 2 may be silicon, germanium, gallium arsenide, aluminum-gallium arsenide, Indium phosphide or another III–V or II–VI semiconductor, or an insulator. The processing materials may be metals, semiconductors and/or insulators, and can be a combination of these.

A wafer 8 used in the dual-side processing of this embodiment is cut thicker from the original ingot that conventional wafers. The reason is that the final product of this processing technique is two unilaterally processed wafers. Therefore, looking ahead, the thickness of the wafer 8 is selected to accommodate two processed wafers and the material lost during re-slicing. Preferably then, the original wafer 8 selected is more than twice the thickness of conventional wafers by the amount of thickness lost during re-slicing.

To create a dual-side processed substrate 8, the topside 4 and the underside 6 of the substrate 2 are both first polished.

Then the substrate 2 is loaded into processing equipment. This equipment is modified in the following way. The equipment used for loading, aligning, processing and unloading is modified to handle and accommodate thicker wafers, as described above. Also, the equipment used in this embodiment is modified from conventional unilateral processing equipment such that the undersides 6 of the wafers 8 are not molested either before, during or after processing. One method of dual-side processing is disclosed in U.S. Pat. No. 4,782,028 to Farrier et al. The method involves forming a detector device on two sides of a silicon substrate. There is a first portion of the substrate which is to be processed on two sides and a second portion outside the first portion wherein the wafer is handled on two sides without contacting the first portion. Each polished side of the first portion of the substrate 2 is processed utilizing various procedures, materials and ordering of procedures and materials to achieve a unique electrical structure.

Dual-side mask alignment will normally precede many steps in the processing, and involves considerations particular to dual-side alignment. A technique for dual-side alignment of reticles or masks is disclosed in U.S. Pat. No. 3,939,579 to Schmidt and in U.S. Pat. No. 5,530,552 to Mermagen and Geil.

Depending on the IC being created on each side, processing steps may include alignment of both the topside 4 and underside 6 with a reticle and/or a mask, as stated, and exposure to radiation or an electronic or molecular beam, chemical or reactive-ion etching of portions of previously grown or deposited layers or the substrate itself. Implantation, growth, often of oxide layers at enhanced temperatures in a reactive atmosphere, chemical vapor deposition of metals or other materials, sometimes followed by diffusion, photo-engraving, sputtering and the like may also be performed. Some procedures are repeated several times, and more than one mask may be used in one or more steps. A plurality of different materials may be used including metals, insulators, semiconductors and plasmas. Some materials and some procedures are not used depending on the type of IC being processed. The sum of multiple procedures performed on each side of a substrate 2, in varying patterns and areas of each side, results in the formation of one or more integrated circuits (IC's).

A dual-side processed substrate 8 includes the original substrate 2 and topside processing 10 and underside processing 12. The topside processing 10 and the underside processing 12 may or may not be identical. The dual-side processed substrate 8 is unloaded after dual side processing from the processing equipment.

Figure 1C:
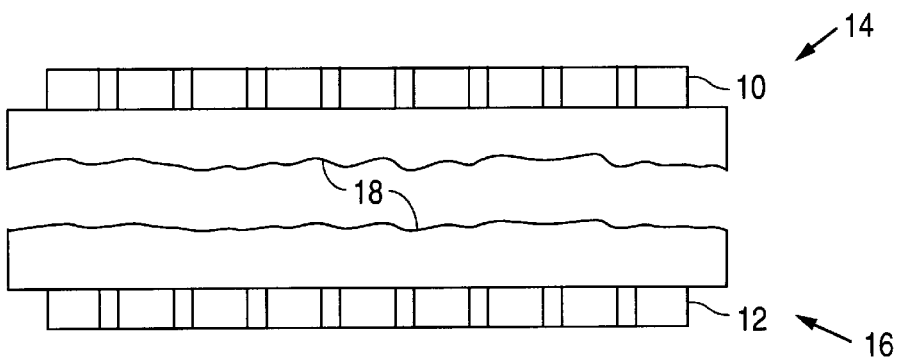
FIG. 1C is a side view of two one-side processed substrates remaining after dual-side processing and re-slicing of an original substrate, according to a first embodiment of the present invention.

Referring to FIG. 1C, the dual-side processed substrate 8 is then loaded into re-slicing equipment, and re-sliced into a first one-side processed substrate 14 and a second one-side processed substrate 16. The technique described in Japanese Patent Number Sho 64-19729 is exemplary of a technique that may be implemented into the procedure of the present invention. A thicker than normal wafer is cut from the original ingot. The thickness of the wafer cut includes two conventional wafer thicknesses and an additional thickness accounting for the material lost during re-slicing. The unprocessed wafer is then polished in a conventional manner. After dual-side processing, a diffusion process is preferably performed, while the wafer is being heated to a temperature less than substantially 400° C. Subsequently, the wafer is divided into two parts. The jagged unprocessed sides of each of the two parts is then background until the wafers have conventional thicknesses.

Figure 1D:
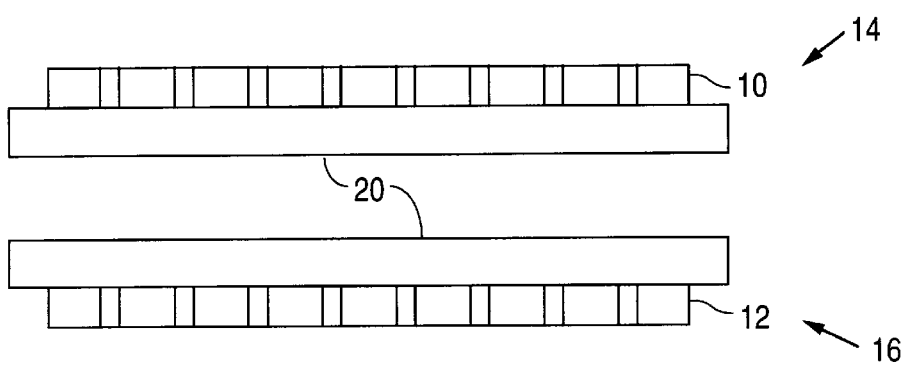
FIG. 1D is a side view of the two substrates of FIG. 1C after underside polishing of each substrate, according to the first embodiment of the present invention.

The wafer may be handled as above with the first processed portion being unmolested and wafer handling equipment contacting only the second portion outside the first processed portion. Re-slicing is done by cutting the wafer into two thinner wafers. Each substrate has one jagged and unpolished side 18 due to the re-slicing. The topside processing 10 and the underside processing 12 are unmolested during re-slicing and remain intact. The first one-side processed substrate 14 retaining the topside processing 10 and the second one-side processed substrate 16 retains the underside processing 12. Referring to FIG. 1D, each jagged edge is then polished using a conventional Chemical Mechanical Polishing technique, leaving a polished side 20 on each one-side processed substrate 14, 16. Each of the two wafers has a thickness of approximately that of a conventional unilaterally processed wafer after polishing.

Figure 2A:
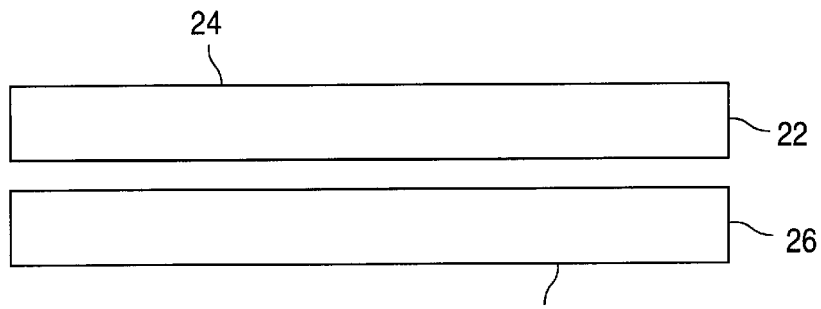
FIG. 2A is a side view of two conventional, polished, yet otherwise unprocessed substrates.

According to a second embodiment of the present invention, FIG. 2A shows two conventional substrates that have been polished on at least one side. The first substrate 22 is polished on its topside 24 and the second substrate 26 is polished on its underside 28. It is preferred, however, that both sides of each substrate be polished.

Figure 2B:
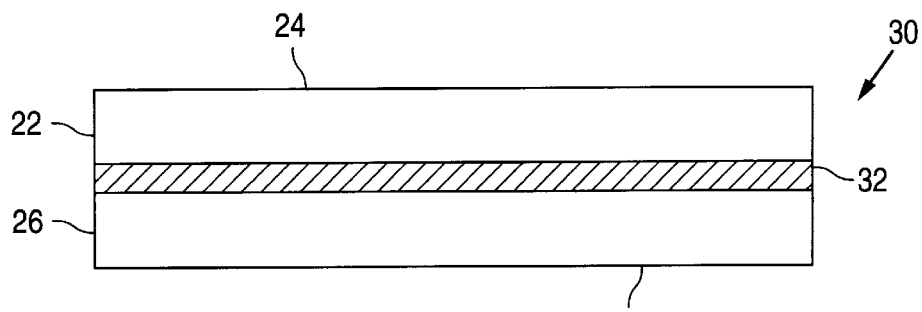
FIG. 2B is a side view of two polished and attached, yet otherwise unprocessed substrates, according to a second embodiment of the present invention.

Referring to FIG. 2B, the first substrate 22 and the second substrate 26 are next attached to form an attached substrate 30. The two substrates 22, 26 are preferably attached by an adhesive 32, but may be attached in another way including fastening, clamping, vacuum adhesion and pressure bonding, such that the areas of the wafers to be processed is clear and the wafers are not damaged as a result of the attachment or later detachment.

Figure 2C:
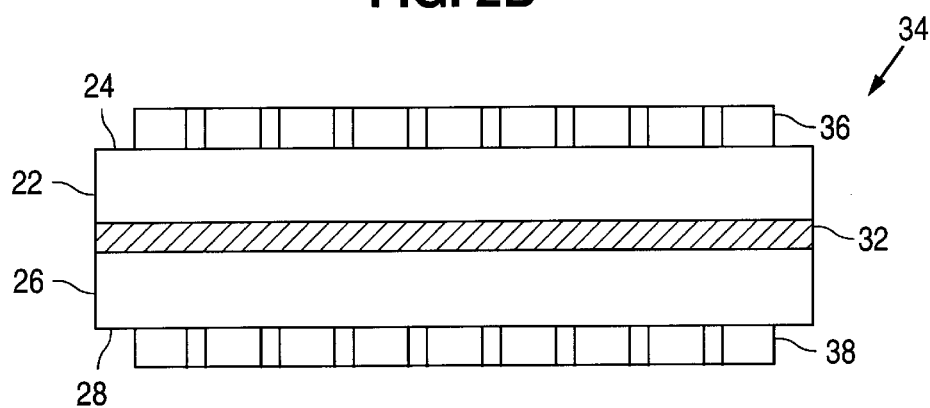
FIG. 2C is a side view of two attached and processed substrates, according to the second embodiment of the present invention.

Referring to FIG. 2C, the attached substrate 30 is now processed on both sides as described above. After processing, a dual-side processed, attached substrate 34 includes the original attached substrate 30 and a topside processing 36 of the first substrate 22 and an underside processing 38 of the second substrate 26.

Figure 2D:
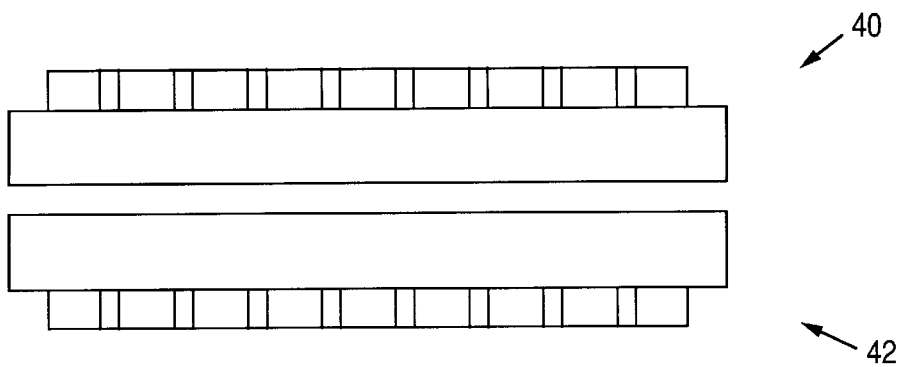
FIG. 2D is a side view of two detached and processed substrates, according to the second embodiment of the present invention.

Referring to FIG. 2D, the dual-side processed, attached substrate 34 is next detached. That is, a first processed substrate 40 comprising the first substrate 22 and the topside processing 22 of the first substrate 22, and a second processed substrate 42 comprising the second substrate 26 and the underside processing 38 of the second substrate 26 separately remain. The adhesive is removed and two unilaterally processed substrates result from one loading, dual-side processing and unloading procedure, rather than two unilateral procedures as is the conventional method.

Figure 3:
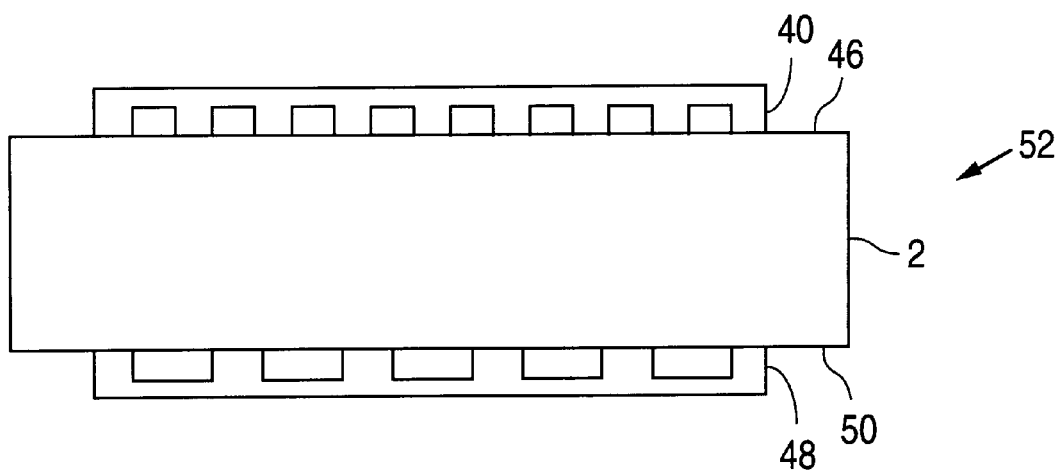
FIG. 3 is a side view of a double-sided chip, according to a third embodiment of the present invention.

According to a third embodiment of the present invention, a conventional substrate 2 is polished on both sides. Referring to FIG. 3, dual-side processing is performed in accord with the method, i.e., polishing, loading, alignment, dual-side processing, and unloading, described earlier. A first subsystem 44 of a complete IC is processed on the topside 46 of the chip and a second subsystem 48 of the same IC is processed on the underside 50 of the same chip. The first and second subsystems are electrically interconnected and comprise a single integrated circuit. The result is a double sided chip 52 containing a full system. The first subsystem 44 and the second subsystem 48 work as complementary components of the same double-sided IC chip 52. In this embodiment, the wafer can be a standard thickness or more. A thicker than conventional wafer is not used here because no re-slicing is performed after the dual-side processing. The wafer is then cut into separate chips in a conventional manner.

What is claimed is:

1. A method of fabricating a plurality of electronic devices on an original semiconductor substrate having a first side and a second side, the method comprising the steps of:

processing an integrated circuit device on each of said first and second sides such that each side becomes a processed side, and slicing the original substrate between the first and second processed sides, thereby separating the original substrate into two new substrates.

2. A method as in claim 1, further comprising the step of back-grinding each unprocessed side of each new substrate.

3. A method as in claim 1, wherein said processing step comprises the step of photolithographically exposing said first side and said second side of the original substrate.

4. A method as in claim 1, wherein said first side is substantially coplanar with said second side and the slicing step separates the two coplanar sides by slicing in a plane between and coplanar with the two coplanar sides.

5. A method as in claim 1, further comprising the step of polishing said first and second sides of said substrate before processing the integrated circuit device.

6. A method as in claim 1, further comprising the step of aligning a first reticle with said first side and a second reticle with said second side.

7. A method of simultaneously fabricating a first integrated circuit device on a first semiconductor substrate and a second integrated circuit device on a second semiconductor substrate, the method comprising the steps of:

connecting a second side of said first substrate to a second side of said second substrate to form a double wafer assembly having each first side of each of said first and second substrates as a side of the double wafer assembly;

processing an integrated circuit device on each side of the double wafer assembly so that each first side of said first and second substrates becomes processed; and separating said first and second substrates.

8. The method of claim 7, further comprising the step of aligning a first reticle with one side of the double wafer assembly and a second reticle with another side of the double wafer assembly.

9. A method as in claim 7, wherein said processing step comprises the step of photolithographically exposing each side of the double wafer assembly.

10. A method as in claim 7, wherein the sides of the double wafer assembly are substantially coplanar.

11. A method as in claim 7, wherein the attaching step uses a bonding adhesive.

12. A method of fabricating an integrated circuit on a semiconductor substrate having a first side and a second side, the method comprising the steps of:

processing a first subsystem of said integrated circuit on said first side; and processing a second subsystem of said integrated circuit on said second side, wherein said first and second subsystems are electrically interconnected and comprise a single integrated circuit.

* * * * *